(12) United States Patent
Fischer et al.

(10) Patent No.: US 7,773,332 B2
(45) Date of Patent: Aug. 10, 2010

(54) LONG HOLD TIME SAMPLE AND HOLD CIRCUITS

(75) Inventors: Jonathan H. Fischer, Longmont, CO (US); Michael P. Straub, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 785 days.

(21) Appl. No.: 10/719,645

(22) Filed: Nov. 21, 2003

(65) Prior Publication Data

US 2005/0111128 A1    May 26, 2005

(51) Int. Cl.
*G11B 5/02* (2006.01)
*G11C 27/02* (2006.01)

(52) U.S. Cl. .............................. 360/67; 360/46; 360/66; 360/68; 327/91; 327/92; 327/94; 327/96

(58) Field of Classification Search ..................... 360/67
See application file for complete search history.

(56) References Cited

U.S. PATENT DOCUMENTS

| | | | | |
|---|---|---|---|---|
| 4,352,070 A | * | 9/1982 | Beauducel et al. ............. | 327/95 |
| 4,370,572 A | * | 1/1983 | Cosand et al. ................. | 327/96 |
| 5,036,219 A | * | 7/1991 | Dingwall et al. .............. | 327/92 |
| 5,172,117 A | * | 12/1992 | Mills et al. ................... | 341/137 |
| 5,313,113 A | * | 5/1994 | Linder .......................... | 327/92 |
| 5,331,478 A | * | 7/1994 | Aranovsky .................... | 360/67 |
| 5,341,037 A | * | 8/1994 | Miki et al. .................... | 327/96 |
| 5,422,583 A | | 6/1995 | Blake et al. ................... | 327/94 |
| 5,572,154 A | * | 11/1996 | Rakers et al. ................. | 327/92 |
| 5,612,698 A | | 3/1997 | Reay ........................... | 341/167 |
| 5,825,571 A | * | 10/1998 | Sandusky et al. ............. | 360/67 |
| 5,838,175 A | * | 11/1998 | Hsieh ............................ | 327/94 |
| 6,028,459 A | * | 2/2000 | Birdsall et al. ................ | 327/94 |
| 6,054,887 A | * | 4/2000 | Horie et al. ................... | 327/307 |
| 6,069,502 A | | 5/2000 | Preslar et al. ................. | 327/94 |

(Continued)

FOREIGN PATENT DOCUMENTS

JP    7220207 (A)    8/1995

OTHER PUBLICATIONS

Horowitz et al., "The Art of Electronics," Second Edition, Cambridge University Press, pp. 217-219 (1989).

(Continued)

*Primary Examiner*—Dismery E Mercedes
(74) *Attorney, Agent, or Firm*—Ryan, Mason & Lewis, LLP

(57) ABSTRACT

A sample and hold circuit is disclosed that provides longer hold times. The sample and hold circuit can be used in a disc drive to provide improved read-to-write and write-to-read mode transitions. The sample and hold circuit has an input and an output, and includes at least one capacitive element for retaining a charge. The capacitive element is connected to a node between the input and the output. The sample and hold circuit includes at least one input switch to selectively connect the capacitive element to the input and at least one output switch to selectively connect the capacitive element to the output. In addition, an amplifier is connected to the node and has an offset voltage. In this manner, a voltage drop across at least one of the input and output switches is limited to the offset voltage.

20 Claims, 4 Drawing Sheets

U.S. PATENT DOCUMENTS

| | | | |
|---|---|---|---|
| 6,111,467 A * | 8/2000 | Luo | 330/305 |
| 6,262,677 B1 * | 7/2001 | Kiriaki et al. | 341/122 |
| 6,323,696 B1 * | 11/2001 | Hickling et al. | 327/92 |
| 6,335,653 B1 | 1/2002 | Shigehara et al. | 327/534 |
| 6,522,491 B1 * | 2/2003 | Kawai | 360/66 |
| 6,570,516 B1 * | 5/2003 | Barker | 341/122 |
| 6,721,117 B2 * | 4/2004 | Briskin | 360/66 |
| 6,909,249 B2 * | 6/2005 | Otake | 315/291 |
| 7,034,607 B2 * | 4/2006 | Otake | 327/590 |
| 2001/0026175 A1 | 10/2001 | Ueno | 327/94 |

OTHER PUBLICATIONS

Mitsuhara, T., "Sample/Holding Circuit," JP 61 099998 Patent Abstract of Japan, vol. 10, No. 278 (May 19, 1986).

Takao, A., "Sample Holding Circuit," JP 57 060593 Patent Abstract of Japan vol. 6, No. 137 (Apr. 12, 1982).

* cited by examiner

LONG HOLD TIME SAMPLE AND HOLD CIRCUITS

FIELD OF THE INVENTION

The present invention relates generally to sample and hold circuits, and more particularly, to sample and hold circuits that provide longer hold times.

BACKGROUND OF THE INVENTION

Disc drives typically use magneto-resistive read heads to support high data densities. These magneto-resistive heads require a DC bias to operate (typically provided by a preamplifier). In a mobile application, however, power consumption is an important issue. Thus, a number of techniques have been proposed or suggested to reduce the power consumption of disc drives for mobile applications. Biasing of magneto resistive heads is also varied over time to extend the lifetime of the sensor. For example, sample and hold circuits have been proposed to allow the bias control circuits of the read head to be powered down when writing data to the disc while maintaining short write-to-read transition times.

In one proposed implementation of a sample and hold circuit, the disc drive power consumption was effectively reduced, but the maximum hold time was only on the order of 30 microseconds, due to switch leakage paths. For a number of applications, however, a longer hold time may be necessary. A need therefore exists for a disc drive having a sample and hold technique with a longer hold time. A further need exists for a disc drive employing a sample and hold technique that provides improved read-to-write and write-to-read mode transitions.

SUMMARY OF THE INVENTION

Generally, a sample and hold circuit is disclosed that provides longer hold times. The disclosed sample and hold circuit can be used in a disc drive to provide improved write-to-read mode transitions. The sample and hold circuit has an input and an output, and includes at least one capacitive element for retaining a charge. The capacitive element is connected to a node between the input and the output. The sample and hold circuit includes at least one input switch to selectively connect the capacitive element to the input and at least one output switch to selectively connect the capacitive element to the output. In addition, an amplifier is connected to multiple nodes and has an offset voltage. In this manner, a voltage drop across at least one of the input and output switches is limited to the offset voltage.

From a process point of view, a method is provided for reducing leakage in a sample and hold circuit having at least one capacitive element for retaining a charge. The method comprises the steps of (i) configuring at least one input switch to selectively connect the at least one capacitive element to the input; (ii) configuring at least one output switch to selectively connect the at least one capacitive element to the output; and (iii) limiting a voltage drop across at least one of the input and output switches to an offset voltage of an amplifier connected to the input or output node.

The disclosed sample and hold circuit can be used, for example, in a preamplifier for a head bias circuit in a storage system. In a further variation, the sample and hold circuit includes at least two switches that selectively connect at least one of the input and output switches to an output of the amplifier in a hold mode or to standard voltages in read mode, in order to reduce leakage effects due to parasitic diodes in the input and output switches.

A more complete understanding of the present invention, as well as further features and advantages of the present invention, will be obtained by reference to the following detailed description and drawings.

DETAILED DESCRIPTION

Figure 1:
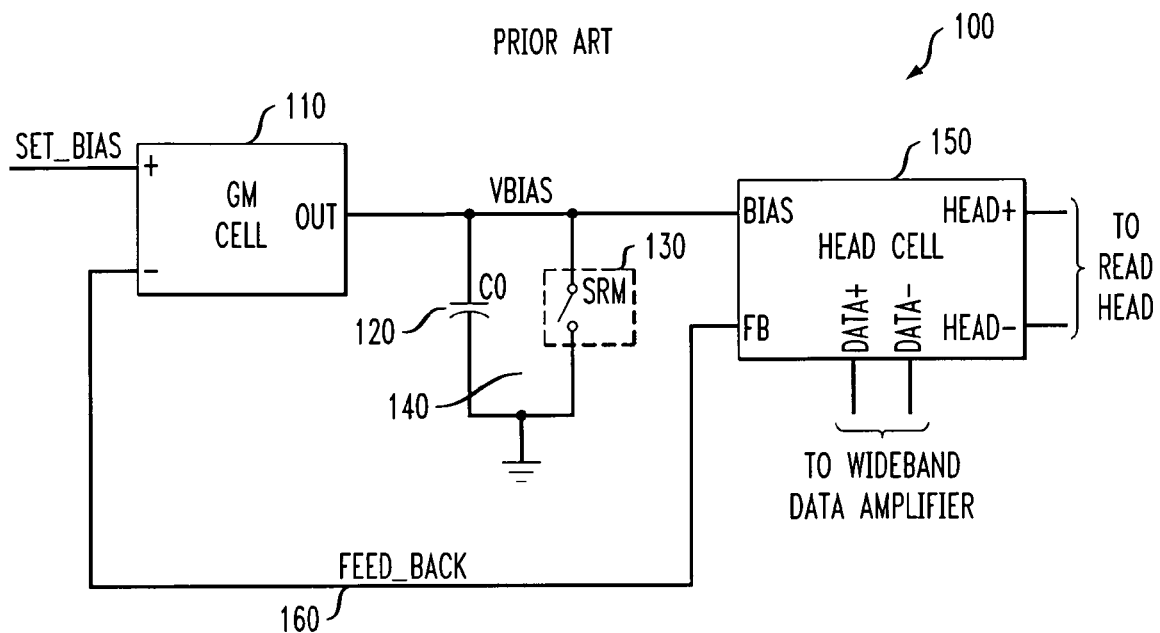
FIG. 1 is a schematic block diagram of a conventional preamplifier head bias circuit.

FIG. 1 is a schematic block diagram of a conventional preamplifier head bias circuit 100. The preamplifier head bias circuit 100 may be used, for example, in a disk drive to bias a magneto-resistive sensor for reading. As shown in FIG. 1, the preamplifier head bias circuit 100 includes a transconductance (GM) cell 110, a bias capacitor 120 in parallel with a short read head bias (SRM) switch 130, and a head cell 150. The output of the head cell 150 is provided to the read head (not shown). Thus, the positive and negative outputs of the head cell 150 carry both the DC bias and data signal. Generally, the transconductance cell 110 takes an input voltage and generates an output current, in a known manner. In a read mode, a feedback loop 160 is connected to the negative input of the transconductance cell 110 to force the head DC voltage to the SET_BIAS level that is set at the positive input of the transconductance cell 110. The bandwidth of the bias loop 140 is set lower than the data spectrum to prevent data waveform distortion. To maximize read head life and minimize power dissipation, the head bias is turned off by switch SRM 130 when not reading data from the disc. The internal bias level (VBIAS) must be restored at the start of the next read period.

To meet the write-to-read specification (such as less than 125 ns for exemplary mobile drives), a high power, wide bandwidth feedback loop 160 is needed if VBIAS must be re-acquired at the start of each read period (the loop bandwidth is then reduced for the remainder of the read period). The loop power dissipation and complexity can be significantly reduced if the value of VBIAS is stored during write mode so the head can be quickly be set to the proper bias level at the start of the next read period.

Digital or analog methods can store VBIAS. The digital approach (storage register or up/down counter, digital-to-analog conversion (DAC), and comparator) offers unlimited hold time. The analog approach employs a sample and hold circuit that takes less area and power. With the analog approach, however, care must be taken to provide a hold time on the order of 200 microseconds time while in write mode without excessive VBIAS drift. The present invention extends the analog sample and hold time, for example, to a value on the order of 200 microseconds, while meeting tight area and power constraints.

Figure 2:
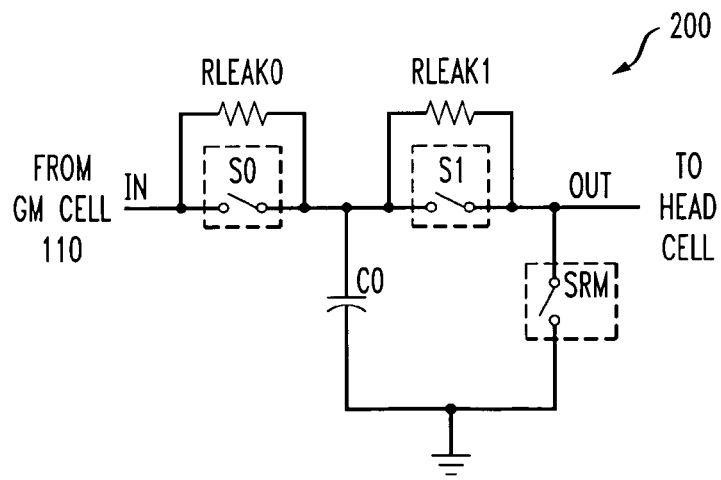
FIG. 2 is a schematic block diagram of a conventional sample and hold circuit that may be used in the preamplifier of FIG. 1.

FIG. 2 shows a conventional sample and hold circuit 200 to retain the steady state read mode VBIAS voltage while in the write mode. The sample and hold circuit 200 is typically built using metal oxide semiconductor (MOS) switches. As shown in FIG. 2, capacitor C0 filters the electrical noise generated in the GM cell 110 and switch S0. Switch S1 must have low resistance when closed so it will not add excessive noise to the bias voltage sent to the head cell. Switch S1 is typically built using short channel MOS devices, which have significant leakages when powered down (open). As shown in FIG. 2, the leakage in an off state, represented by resistors RLEAK0 and RLEAK1, causes the voltage held on capacitor C0 to change (droop) when switches S0 and S1 are open. The droop rate limits the length of time the capacitor voltage stays within a given error band.

While the preamplifier head bias circuit 100 is in a write mode, switch SRM 130 keeps the head cell bias input at ground. At the start of the read mode, switch SRM 130 opens and switches S0 and S1 close. Some of the charge on the capacitor C0 redistributes to the head cell bias line capacitance when switch S1 closes. The loop must now restore the voltage across capacitor C0 to the steady state level.

Thus, the sample and hold circuit 200 of FIG. 2 does not provide a sufficient hold time due to the leakage paths represented by RLEAK0 and RLEAK1. According to one aspect of the present invention, the preamplifier head bias circuit 100 of FIG. 1 is modified to drive sample and hold nodes to reduce the hold switch leakage currents and thereby provide a hold time on the order of 200 microseconds. Thus, a disc drive incorporating the modified preamplifier head bias circuit can maintain a write mode for up to 200 microseconds. In this manner, the preamplifier head bias circuit in accordance with the present invention simultaneously provides (i) lower power dissipation, (ii) faster write-to-read mode transitions and (iii) longer hold modes (on the order of 200 microseconds).

Figure 3:
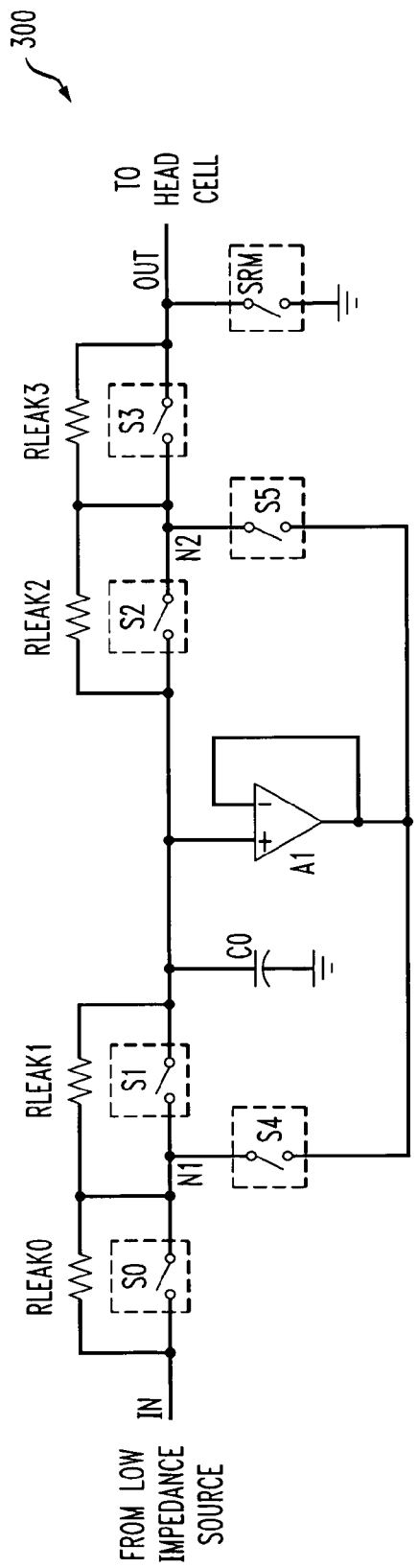
FIG. 3 illustrates a sample and hold circuit having low leakage in accordance with the present invention.

FIG. 3 illustrates a sample and hold circuit 300 having low leakage in accordance with the present invention. The sample and hold circuit 300 reduces the effects of switch off leakage and head cell bias line capacitance. As shown in FIG. 3, the sample and hold switches S0 and S1 from FIG. 2 have each been replaced by two switches in series, S0 and S1, and S2 and S3, respectively. In a read mode, switches S0, S1, S1 and S3 are closed and switches SRM, S4, and S5 are open. The feedback loop charges capacitor C0 to the intended voltage.

In a write mode, switches S0 through S3 are open and switches S4, S5, and SRM are closed. In accordance with the present invention, an amplifier A1 drives nodes N1 and N2 to track the voltage of capacitor C0. In this manner, the voltage across RLEAK1 and RLEAK2 is reduced to the offset voltage of amplifier A1 (on the order of milli-Volts instead of Volts). Thus, when switches S1 and S2 are opened, there is only a small voltage drop across the resistors RLEAK 1 and RLEAK 2, and very little current through the resistors (thereby significantly reducing the leakage). Amplifier A1 may be embodied, for example, as a MOS amplifier so that the small input current of amplifier A1 has little effect on the circuit operation. The new topology allows minimum channel length switches to minimize noise added to the head bias signal without excessive signal droop when holding the bias level.

Proper switch sequencing can eliminate the start up charge sharing between capacitor C0 and the head cell capacitance. For example, at the start of a read mode, switch SRM can be opened first before switch S3 is closed. Amplifier A1 then charges the head cell capacitance to equal the voltage on capacitor C0 without capacitor C0 losing charge. Thereafter, switches S4 and S5 are opened and switches S0 through S2 are closed to complete the head bias feedback loop.

Figure 4:
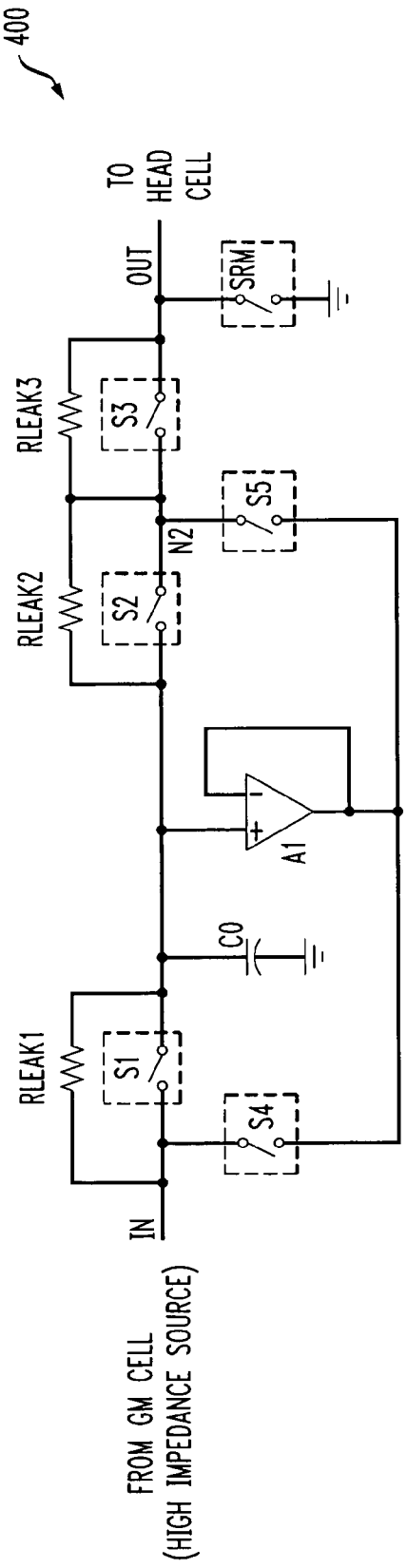
FIG. 4 illustrates an alternate sample and hold circuit having low leakage in accordance with the present invention.

FIG. 4 illustrates an alternate sample and hold circuit 400 having low leakage in accordance with the present invention. The sample and hold circuit 400 of FIG. 4 is a simplification for a preamplifier application, where switch S0 has been removed. The sample and hold circuit 400 of FIG. 4 recognizes that the GM cell 110 of FIG. 1 has a high impedance current source output. When in the hold mode, amplifier A1 keeps the output of GM cell 110 close to the closed loop voltage to minimize transients when changing from the hold to closed loop modes. The amplifier A1 controls the leakage through the resistors RLEAK1 and RLEAK2 and supplies current such that there is minimal drift through the resistor RLEAK3.

It is noted that the leakage of the switches in the sample and hold circuits 300, 400 is represented in FIGS. 3 and 4 by resistances RLEAK0 through RLEAK3, which are attributed to leakage effects of the drain to source path of the MOS devices. In addition to such drain to source leakage effects, however, there is also a leakage effect due to parasitic diodes in the MOS switches. In the sample and hold circuits 300, 400 of FIGS. 3 and 4, for example, there is a parasitic diode leakage effect.

Figure 5:
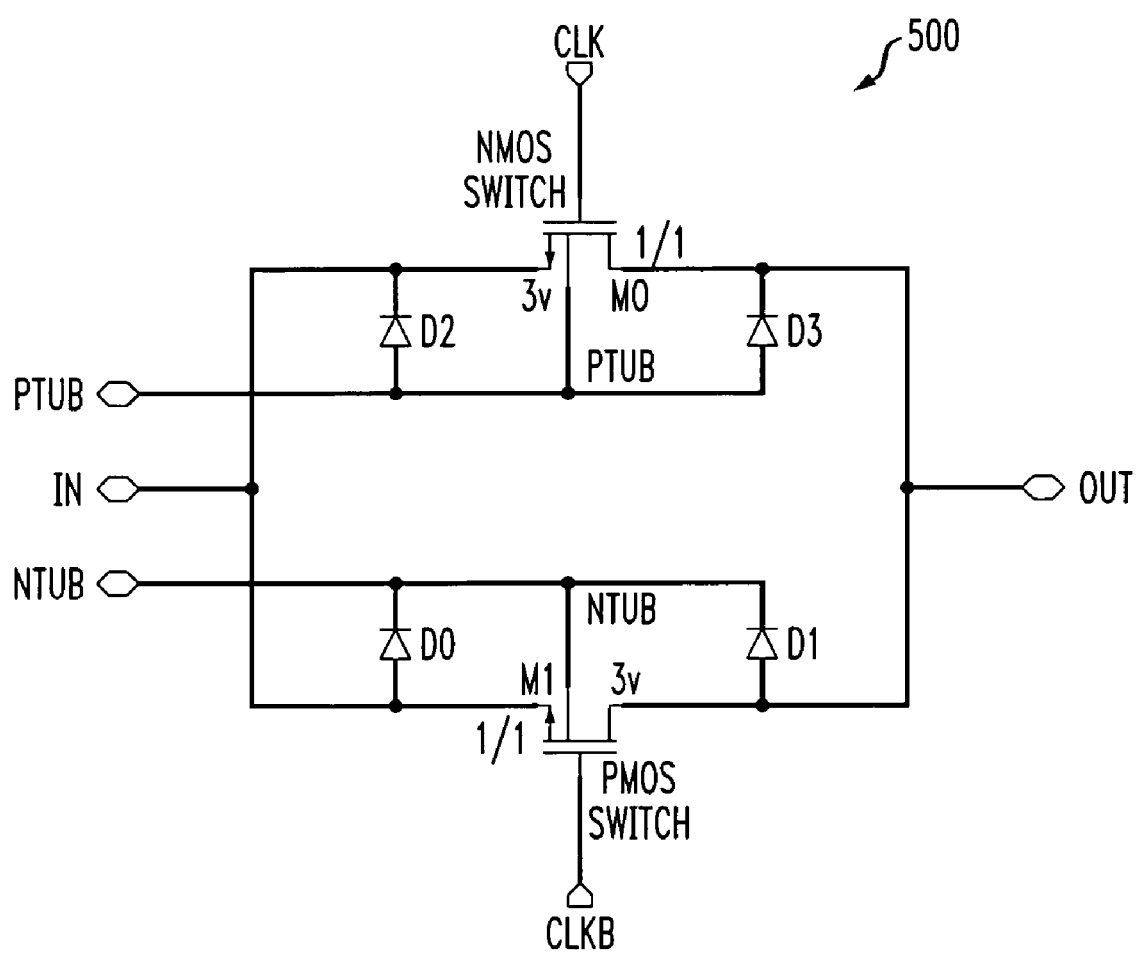
FIG. 5 is a schematic diagram of an exemplary CMOS switch suitable for use in the sample and hold circuits of the present invention.

FIG. 5 is a schematic diagram of an exemplary CMOS switch 500 suitable for use in the sample and hold circuits 300, 400 of the present invention. As shown in FIG. 5, in addition to the switch off resistance, the transistors also have parasitic drain and source diodes, shown as D0-D3. The NTUB is tied to a voltage that is more positive than the input signal (typically tied to VCC, VDD), so the diodes D0 and D1 tend to pull the signals IN and OUT up towards the power supply. The PTUB is tied to a voltage that is more negative than the input signal (typically tied to ground), so the diodes D2 and D3 tend to pull the signals IN and OUT towards ground. The net effect of the diode leakage currents is difficult to predict because of the variation in leakage with temperature and process.

Figure 6:
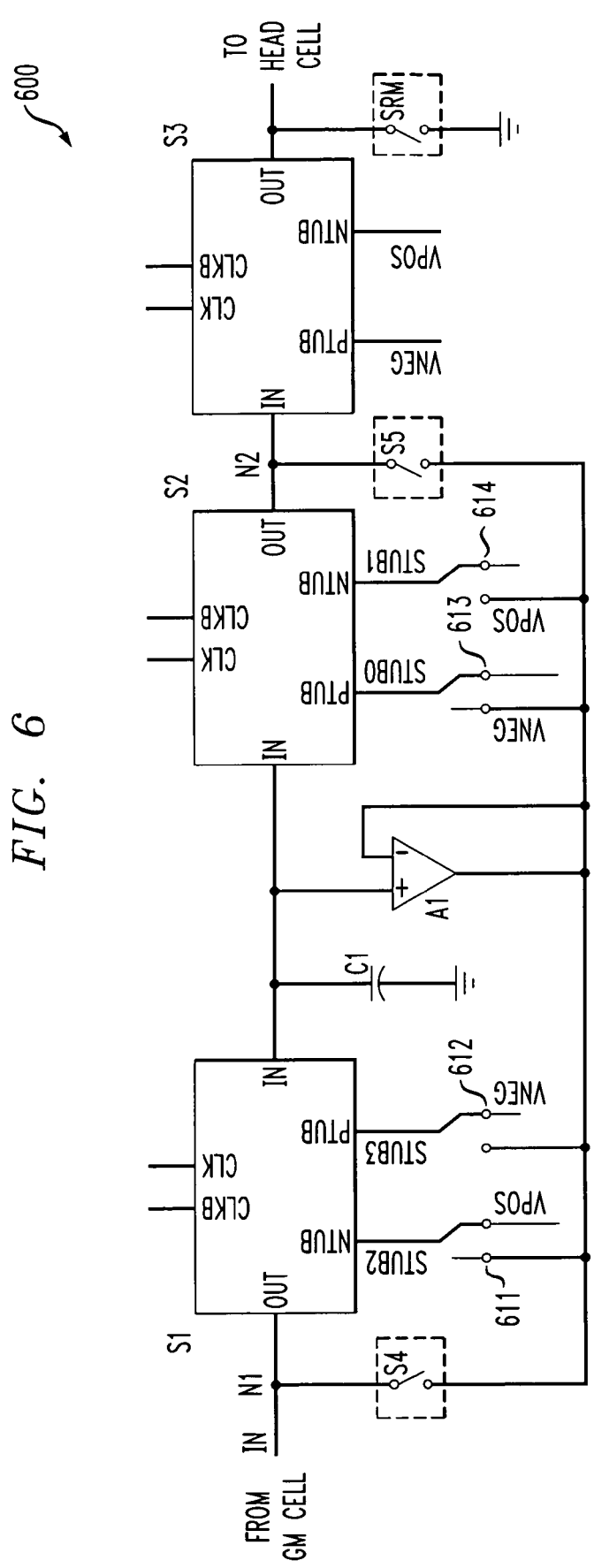
FIG. 6 illustrates an alternate sample and hold circuit having low leakage in accordance with the present invention.

Thus, according to another aspect of the present invention, a sample and hold circuit 600 is provided that reduces the leakage effects of both the drain to source paths and the parasitic diodes in the MOS switches. FIG. 6 illustrates an alternate sample and hold circuit 600 having low leakage in accordance with the present invention. It is noted that NTUB and PTUB, shown in FIG. 5, are generally junction isolated from the substrate in a triple well process used for preamplifiers.

The sample and hold circuit 600 of FIG. 6 recognizes that the isolated tubs can be advantageously used to reduce the diode leakage currents in a hold mode. As shown in FIG. 6, the sample and hold circuit 600 includes four switches 611-614 to control whether the MOS switches S1 through S3 are connected to the output of the amplifier A1 or to standard voltages (VPOS and VNEG). The four switches 611-614 may each be embodied as the MOS switch 500, shown in FIG. 5.

In a sample mode, the four switches 611-614 are configured to select the standard voltages (VPOS and VNEG) and thereby tie the tubs to the standard voltages to ensure that the parasitic diodes D0-D3 are reverse biased for the input/output signal range. In a hold mode, the four switches 611-614 are configured to select the out of the amplifier A1 which drives the switch transistor tubs and nodes N1 and N2. In the hold mode, the voltage across S1 and S2 and their parasitic diodes are thus all reduced to the offset voltage of amplifier A1. In the sample mode, switches S1-S3 are closed, switch S4 and S5 are open, and switches 611-614 connect the tubs to VPOS and VNEG.

Switch S0 can be included in an alternate implementation of the sample and hold circuit 600 of FIG. 6 when the sample and hold circuit 600 is driven from a lower impedance source than the GM cell 110, in the manner described above for FIGS. 3 and 4. In such an alternate implementation of the sample and hold circuit 600, the tubs of switch S0 are connected directly to VNEG and VPOS, in a similar manner to switch S3.

It is to be understood that the embodiments and variations shown and described herein are merely illustrative of the principles of this invention and that various modifications may be implemented by those skilled in the art without departing from the scope and spirit of the invention.

We claim:

1. A sample and hold circuit having an input and an output, comprising:
   at least one capacitive element for retaining a charge, said at least one capacitive element connected to a node between said input and said output;
   at least one input switch for selectively connecting said at least one capacitive element to said input;
   at least one output switch for selectively connecting said at least one capacitive element to said output; and
   an amplifier connected to said node, wherein said amplifier has an offset voltage and wherein a voltage drop across at least one of said input and output switches is substantially limited to said offset voltage, wherein parasitic drain and source diodes (D0, D1) of an NMOS switch are coupled to a voltage that is more negative than an input signal of said NMOS switch in a sample mode, wherein said parasitic drain and source diodes of said NMOS switch are coupled to an output of said amplifier in a hold mode, wherein parasitic drain and source diodes (D2, D3) of a PMOS switch are coupled to a voltage that is more positive than an input signal of said PMOS switch in a sample mode, and wherein said parasitic drain and source diodes of said PMOS switch are coupled to an output of said amplifier in a hold mode.

2. The sample and hold circuit of claim 1, wherein said sample and hold circuit is part of a preamplifier for a head bias circuit in a storage system.

3. The sample and hold circuit of claim 1, wherein at least one of said input and output switches has a leakage effect represented by a resistor in parallel with said input or output switch and a voltage drop across said resistor is limited to said offset voltage.

4. The sample and hold circuit of claim 1, further comprising at least two switches associated with at least one of said input and output switches, wherein said at least two switches selectively connect at least one of said input and output switches to an output of said amplifier in said hold mode or standard voltages in said sample mode to reduce leakage effects due to parasitic diodes in said at least one of said input and output switches.

5. The sample and hold circuit of claim 1, wherein said output provides a DC bias for a magneto-resistive head in a disk drive.

6. The sample and hold circuit of claim 1, wherein said sample and hold circuit provides a hold time of at least approximately 200 microseconds.

7. The sample and hold circuit of claim 1, wherein said limited voltage drop across at least one of said input and output switches reduces a leakage of said sample and hold circuit.

8. A method for reducing leakage in a sample and hold circuit having at least one capacitive element for retaining a charge, said method comprising the steps of:
   configuring at least one input switch to selectively connect said at least one capacitive element to said input;
   configuring at least one output switch to selectively connect said at least one capacitive element to said output;
   substantially limiting a voltage drop across at least one of said input and output switches to an offset voltage of an amplifier connected to said at least one capacitive element; and
   substantially limiting leakage current in parasitic drain and source diodes of an NMOS switch by coupling said parasitic drain and source diodes of said NMOS switch to a voltage that is more negative than an input signal of said NMOS switch in a sample mode and by coupling said parasitic drain and source diodes of said NMOS switch to an output of said amplifier in a hold mode, and limiting leakage current in parasitic drain and source diodes of a PMOS switch by coupling said parasitic drain and source diodes of said PMOS switch to a voltage that is more positive than an input signal of said PMOS switch in a sample mode and by coupling said parasitic drain and source diodes of said PMOS switch to an output of said amplifier in a hold mode.

9. The method of claim 8, wherein said sample and hold circuit is part of a preamplifier for a head bias circuit in a storage system.

10. The method of claim 8, wherein at least one of said input and output switches has a leakage effect represented by a resistor in parallel with said input or output switch and a voltage drop across said resistor is limited to said offset voltage.

11. The method of claim 8, further comprising the steps of configuring at least two switches associated with at least one of said input and output switches, wherein said at least two switches selectively connect at least one of said input and output switches to an output of said amplifier in said hold mode or standard voltages in said sample mode to reduce leakage effects due to parasitic diodes in said at least one of said input and output switches.

12. The method of claim 8, wherein said sample and hold circuit provides a hold time of at least approximately 200 microseconds.

13. The method of claim 8, wherein said step of limiting a voltage drop across at least one of said input and output switches reduces a leakage of said sample and hold circuit.

14. A disk drive, comprising:
   a magneto-resistive read head; and
   a sample and hold circuit having an input and an output, comprising:
   (i) at least one capacitive element for retaining a charge, said at least one capacitive element connected to a node between said input and said output;
   (ii) at least one input switch for selectively connecting said at least one capacitive element to said input;
   (iii) at least one output switch for selectively connecting said at least one capacitive element to said output; and
   (iv) an amplifier connected to said node, wherein said amplifier has an offset voltage and wherein a voltage drop across at least one of said input and output switches is limited to said offset voltage, wherein parasitic drain and source diodes (D0, D1) of an NMOS switch are coupled to a voltage that is more negative than an input signal of said NMOS switch in a sample mode, wherein said parasitic drain and source diodes of said NMOS switch are coupled to an output of said amplifier in a hold mode, wherein parasitic drain and source diodes (D2, D3) of a PMOS switch are coupled to a voltage that is more positive than an input signal of said PMOS switch in a sample mode, and wherein said parasitic drain and source diodes of said PMOS switch are coupled to an output of said amplifier in a hold mode.

15. The disk drive of claim 14, wherein said sample and hold circuit is part of a preamplifier for a head bias circuit in a storage system.

16. The disk drive of claim 14, wherein at least one of said input and output switches has a leakage effect represented by a resistor in parallel with said input or output switch and a voltage drop across said resistor is limited to said offset voltage.

17. The disk drive of claim 14, further comprising at least two switches associated with at least one of said input and output switches, wherein said at least two switches selectively connect at least one of said input and output switches to an output of said amplifier in a hold mode or standard voltages in a write mode to reduce leakage effects due to parasitic diodes in said at least one of said input and output switches.

18. The disk drive of claim 14, wherein said output provides a DC bias for a magneto-resistive head in said disk drive.

19. The disk drive of claim 14, wherein said sample and hold circuit provides a hold time of at least approximately 200 microseconds.

20. The disk drive of claim 14, wherein said limited voltage drop across at least one of said input and output switches reduces a leakage of said sample and hold circuit.

* * * * *